(12) United States Patent
Chen et al.

(10) Patent No.: US 8,236,126 B2
(45) Date of Patent: Aug. 7, 2012

(54) ENCAPSULATION METHOD OF ENVIRONMENTALLY SENSITIVE ELECTRONIC ELEMENT

(75) Inventors: Kuang-Jung Chen, Hsinchu County (TW); Shu-Tang Yeh, Taichung County (TW); Ping-I Shih, Chiayi County (TW); Kung-Yu Cheng, Hsinchu (TW); Jian-Lin Wu, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 95 days.

(21) Appl. No.: 12/860,945

(22) Filed: Aug. 23, 2010

(65) Prior Publication Data

US 2012/0012246 A1   Jan. 19, 2012

(30) Foreign Application Priority Data

Jul. 14, 2010   (TW) .............................. 99123107 A (51) Int. Cl.
*B32B 38/10* (2006.01)

(52) U.S. Cl. ........ 156/247; 156/145; 156/232; 156/233; 156/239; 156/250; 264/272.11; 264/272.14

(58) Field of Classification Search .................. 156/145, 156/232, 233, 239, 247, 250, 272.11, 272.14
See application file for complete search history.

(56) References Cited

U.S. PATENT DOCUMENTS

| | | | |
|---|---|---|---|
| 4,083,097 A | 4/1978 | Anagnostou et al. | |
| 6,409,859 B1 * | 6/2002 | Chung | 156/69 |
| 6,428,650 B1 * | 8/2002 | Chung | 156/250 |
| 6,432,253 B1 * | 8/2002 | Chung | 156/295 |
| 6,764,369 B2 | 7/2004 | Lai et al. | |
| 6,803,245 B2 * | 10/2004 | Auch et al. | 438/26 |
| 6,869,329 B2 | 3/2005 | Clark | |
| 6,888,172 B2 | 5/2005 | Ghosh | |
| 6,949,825 B1 | 9/2005 | Guenther et al. | |
| 7,135,352 B2 | 11/2006 | Yokajty et al. | |
| 7,368,307 B2 | 5/2008 | Cok | |

(Continued)

FOREIGN PATENT DOCUMENTS

TW   200505271   2/2005

(Continued)

OTHER PUBLICATIONS

Lungenschmied et al., "Flexible Encapsulation for Organic Solar Cells," Proc. of SPIE 6197, 2006, pp. 619712-1-619712-8.

(Continued)

*Primary Examiner* — Khanh P Nguyen
*Assistant Examiner* — Margaret Squalls
(74) *Attorney, Agent, or Firm* — Jianq Chyun IP Office (57) ABSTRACT

An encapsulation method of an environmentally sensitive electronic element is provided. A first substrate is provided, wherein at least one first alignment mark and a plurality of environmentally sensitive electronic elements are formed on the first substrate. A second substrate is provided, wherein at least one second alignment mark and a plurality of limiting cavities are formed on the second substrate. A plurality of cover lids is respectively disposed in the limiting cavities. An adhesive is formed on the cover lids. The first substrate and the second substrate are laminated together with the first alignment mark and the second alignment mark as reference, so that the environmentally sensitive electronic elements are sealed in the adhesive and located between the first substrate and the second substrate. The second substrate and the cover lids are separated from each other.

13 Claims, 9 Drawing Sheets

U.S. PATENT DOCUMENTS

| | | | |
|---|---|---|---|
| 2003/0019572 A1* | 1/2003 | Low et al. | 156/272.2 |
| 2005/0000634 A1* | 1/2005 | Craig et al. | 156/230 |
| 2009/0314421 A1* | 12/2009 | Xie | 156/230 |
| 2011/0005662 A1* | 1/2011 | Sung | 156/153 |

FOREIGN PATENT DOCUMENTS

| | | |
|---|---|---|
| TW | I262036 | 9/2006 |

OTHER PUBLICATIONS

Han et al., "Novel Encapsulation Method for Flexible Organic Light-Emitting Diodes using Poly (dimethylsiloxane)," Japanese Journal of Applied Physics 47 (12), 2008, pp. 8986-8988.

* cited by examiner

ENCAPSULATION METHOD OF ENVIRONMENTALLY SENSITIVE ELECTRONIC ELEMENT

CROSS-REFERENCE TO RELATED APPLICATION

This application claims the priority benefit of Taiwan application serial no. 99123107, filed on Jul. 14, 2010. The entirety of the above-mentioned patent application is hereby incorporated by reference herein and made a part of specification.

TECHNICAL FIELD

The disclosure relates to an encapsulation method of an electronic element, and more particularly, to an encapsulation method of an environmentally sensitive electronic element.

BACKGROUND

An organic light emitting diode (OLED) is a semiconductor device that can convert electrical power into optical lighting. OLEDs offer high conversion efficiency, self-emission, ultrathin structure, high luminance, high luminous efficiency, high contrast ratio, short response time (can be as short as several microseconds), extra wide viewing angle, low power consumption, wide operating temperature range, and panel flexibility therefore are broadly applied to many different electronic products.

Some conventional techniques for fabricating flexible environmentally sensitive electronic element packages through a roll-to-roll process have been provided, such as those disclosed in the U.S. Pat. Nos. 6,888,172 B2, 6,949,825 B1, and 7,135,352 B2. However, some other conventional techniques that do not use the roll-to-roll process for fabricating environmentally sensitive electronic element packages are also provided, such as the one disclosed in U.S. Pat. No. 6,803,245 B2.

An encapsulation method for fabricating flexible environmentally sensitive electronic elements is disclosed in U.S. Pat. No. 6,803,245 B2, wherein flexible environmentally sensitive electronic element packages are fabricated by using a substrate holder and a cover lid holder. However, in this technique, the cover lid holder and a cover lid have to be fastened together by using an adhesive tape, and the cover lid and a substrate on which environmentally sensitive electronic elements are disposed are aligned with each other according to an alignment mark on the substrate holder and an alignment mark on the cover lid holder. However, when the cover lid is placed on the cover lid holder and the substrate having the environmentally sensitive electronic elements is placed on the substrate holder, alignment accuracy is an important issue of mass production. Accordingly, imprecise alignment may likely be produced when the cover lid and the substrate are bonded together. As a result, the fabrication yield of the product may be affected. Besides, the heating process carried out during the fabrication process may cause the adhesive tape to lose its adhesiveness. As a result, the reliability of the fabrication process may be affected.

SUMMARY

An environmentally sensitive electronic element encapsulation method is introduced herein, wherein the alignment precision is improved, the fabrication yield is effectively increased, and mass production is made possible.

The present disclosure provides an environmentally sensitive electronic element encapsulation method including following steps. A first substrate is provided, wherein at least one first alignment mark and a plurality of environmentally sensitive electronic elements are formed on the first substrate. A second substrate is provided, wherein at least one second alignment mark and a plurality of limiting cavities are formed on the second substrate. A plurality of cover lids is respectively disposed in the limiting cavities. An adhesive is formed on the cover lids. The first substrate and the second substrate are laminated together with the first alignment mark and the second alignment mark as reference, so that the environmentally sensitive electronic elements are sealed in the adhesive and located between the first substrate and the second substrate. The second substrate and the cover lids are separated from each other.

According to an embodiment of the present disclosure, the depth of each of the limiting cavities is T1, the total thickness of each of the cover lids and the adhesive is T2, and T2≧T1.

According to an embodiment of the present disclosure, the environmentally sensitive electronic element encapsulation method further includes following steps. A carrier is provided before the first substrate is provided, wherein the carrier is suitable for carrying the first substrate. The second substrate is removed after the first substrate and the cover lids are laminated together.

According to an embodiment of the present disclosure, the environmentally sensitive electronic element encapsulation method further includes following steps. A release film is disposed in the limiting cavities before the cover lids are respectively disposed in the limiting cavities. The second substrate and the cover lids are separated from each other, and then the cover lids and the release film are separated from each other.

According to an embodiment of the present disclosure, the environmentally sensitive electronic element encapsulation method further includes following steps. A plurality of sealants is respectively formed on the cover lids after the cover lids are respectively disposed in the limiting cavities, wherein the cover lids and the sealants form a plurality of accommodating spaces. The environmentally sensitive electronic elements are located in the accommodating spaces after the first substrate and the second substrate are laminated together.

According to an embodiment of the present disclosure, the step of forming the adhesive further includes following steps. A liquid adhesive is formed in the accommodating spaces through an adhesive dispensing process. The liquid adhesive is pre-cured before the first substrate and the second substrate are laminated together. The liquid adhesive is fully cured to form the adhesive after the first substrate and the second substrate are laminated together.

According to an embodiment of the present disclosure, after the first substrate and the second substrate are laminated together, the environmentally sensitive electronic elements are respectively located in the accommodating spaces, and the sealants respectively surround the environmentally sensitive electronic elements.

According to an embodiment of the present disclosure, the environmentally sensitive electronic element encapsulation method further including performing a singularizing process to form a plurality of environmentally sensitive electronic element packages after the second substrate and the cover lids are separated from each other.

According to an embodiment of the present disclosure, the first substrate has a plurality of substrate units, each of the substrate units is defined by a plurality of cutting lines, the environmentally sensitive electronic elements are respectively located in the substrate units, and the step of performing the singularizing process includes cutting the first substrate along the cutting lines to form the environmentally sensitive electronic element packages.

According to an embodiment of the present disclosure, the environmentally sensitive electronic elements are formed on the first substrate by taking the first alignment mark as a reference point.

According to an embodiment of the present disclosure, the cover lids include a plurality of flexible cover lids.

According to an embodiment of the present disclosure, the first substrate includes a flexible substrate.

According to an embodiment of the present disclosure, the second substrate includes a rigid substrate.

As described above, in the environmentally sensitive electronic element encapsulation method provided by the present disclosure, the first substrate and the second substrate are laminated together by referring to alignment marks on the first substrate and the second substrate. Thus, alignment accuracy between the first substrate and the second substrate is improved, and the fabrication yield of the environmentally sensitive electronic element packages is increased. Moreover, in the present disclosure, the cover lids are disposed in the limiting cavities on the second substrate, and a plurality of environmentally sensitive electronic elements on the first substrate are encapsulated at the same time by laminating the first substrate and the second substrate. Thus, the present disclosure makes the mass production of environmentally sensitive electronic elements simple, and besides, the problems of incomplete separation and adhesive residue in the conventional technique are resolved so that the reliability of the fabrication process and the finished products are improved.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
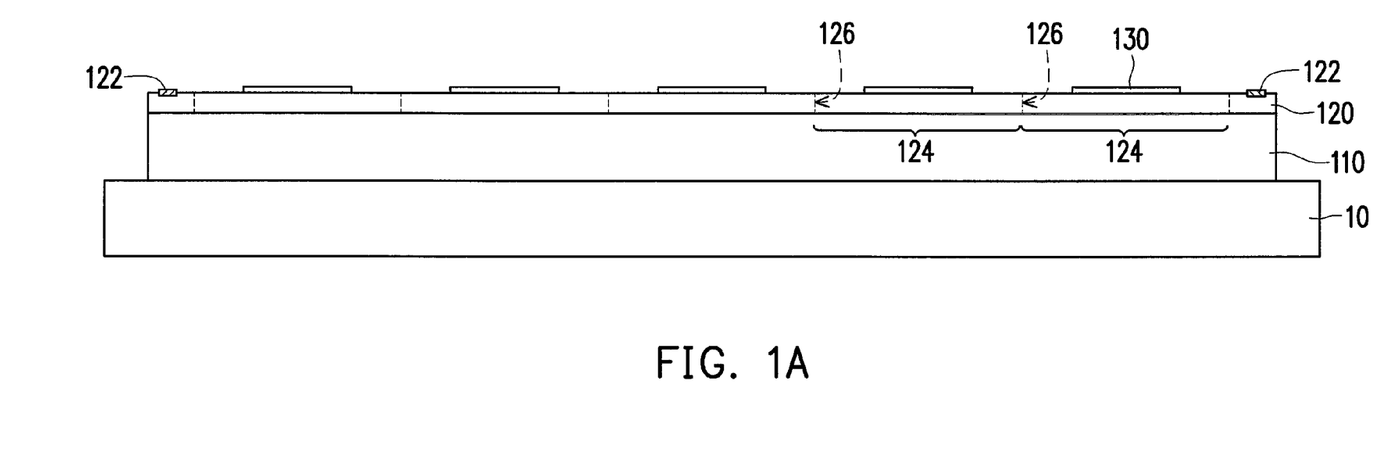
FIGS. 1A-1H are cross-sectional views illustrating an encapsulation method of an environmentally sensitive electronic element according to an embodiment of the present disclosure.

FIGS. 1A-1H are cross-sectional views illustrating an encapsulation method of an environmentally sensitive electronic element according to an embodiment of the present disclosure. Referring to FIG. 1A first, the environmentally sensitive electronic element encapsulation method in the present embodiment includes following steps. First, a carrier 110 disposed on a vacuum chuck 10 is provided, wherein the carrier 110 may be fixed onto the vacuum chuck 10 through vacuum suction.

It has to be stated that how the carrier 110 is fixed is not limited in the present embodiment. Even though herein the carrier 110 is fixed through vacuum suction, any other technique that can provide the same fixing effect may be adopted without departing the scope of the present disclosure.

Then, referring to FIG. 1A again, a first substrate 120 is disposed on the carrier 110. In the present embodiment, at least one first alignment mark 122 (two first alignment marks 122 are illustrated in FIG. 1A) and a plurality of environmentally sensitive electronic elements 130 have been formed on the first substrate 120, wherein the environmentally sensitive electronic elements 130 may be formed on the first substrate 120 by taking first alignment marks 122 as a reference point. The first alignment marks 122 may be texts, patterns, or a combination of text and patterns, and the first alignment marks 122 may be formed on the surface of the first substrate 120 away from the carrier 110 or embedded in the first substrate 120, which is not limited herein.

In the present embodiment, the first substrate 120 has a plurality of substrate units 124. Each of the substrate units 124 is defined by a plurality of cutting lines 126, and the environmentally sensitive electronic elements 130 are respectively disposed in the substrate units 124. The environmentally sensitive electronic elements 130 may be a plurality of active environmentally sensitive electronic display elements or a plurality of passive environmentally sensitive electronic display elements, wherein each of the active environmentally sensitive electronic display elements may be an active matrix organic light emitting diode (AMOLED), an active matrix electro phoretic display (AMEPD, also referred to as electronic paper), an active matrix liquid crystal display (AM-LCD), or an active matrix blue phase liquid crystal display, and each of the passive environmentally sensitive electronic display elements may be a passive matrix OLED (PM-OLED) or a super twisted nematic liquid crystal display (STN-LCD). In addition, the first substrate 120 may be a flexible substrate, and the carrier 110 is suitable for carrying the first substrate 120 such that the structural strength of the first substrate 120 can be increased and subsequent fabrication process can be carried out conveniently.

Figure 1B:
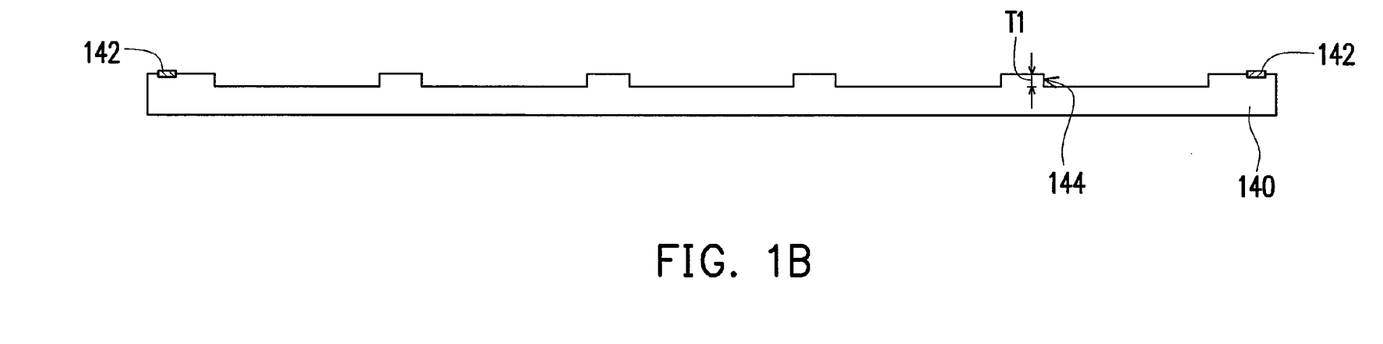

Next, referring to FIG. 1B, a second substrate 140 is provided. At least one second alignment mark 142 (two second alignment marks 142 are illustrated in FIG. 1B) and a plurality of limiting cavities 144 have been formed on the second substrate 140, and the depth of each of the limiting cavities 144 may be T1. In the present embodiment, the second substrate 140 may be a rigid substrate, wherein the rigid substrate may be made of glass or metal. For example, the limiting cavities 144 are formed on a glass substrate by using soda lime glass, borosilicate glass, lead silicate glass, aluminosilicate glass, or silica glass having a thickness between 0.4 mm and 1.1 mm through an etching or sand blasting process. In addition, the second alignment marks 142 may be text, patterns, or a combination of text and patterns, and the second alignment marks 142 may be formed on the surface of the second substrate 140 having the limiting cavities 144 or embedded in the second substrate 140, which is not limited herein.

Figure 1C:
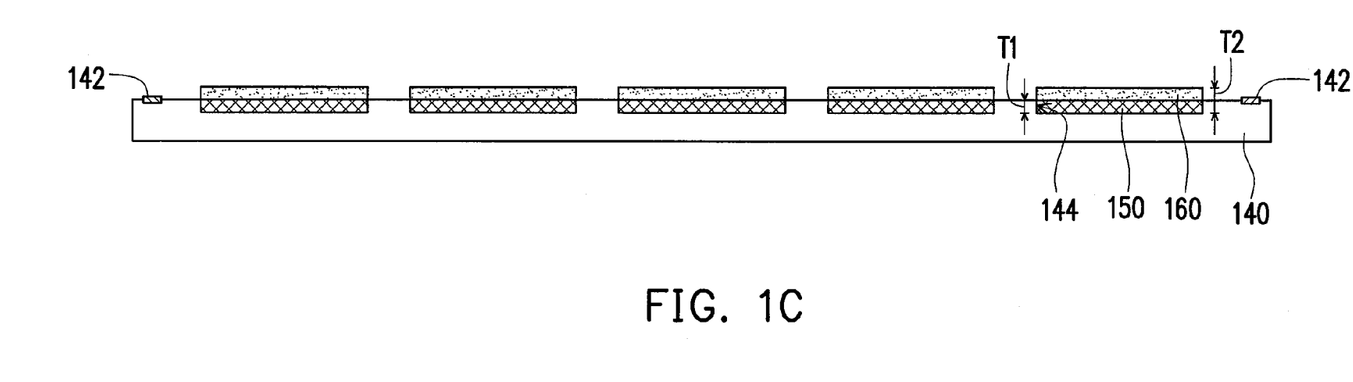

Thereafter, referring to FIG. 1C, a plurality of cover lids 150 is respectively disposed in the limiting cavities 144. The cover lids 150 may be a plurality of flexible cover lids. The cover lids 150 may be made of metal or plastic. Namely, the cover lids 150 may be a plurality of metal foils or plastic plates.

Next, referring to FIG. 1C, an adhesive 160 is formed on the cover lids 150. The adhesive 160 may be made of acrylic or epoxy resin, and the adhesive 160 may be a cured adhesive or an uncured adhesive, wherein the cured adhesive may be a UV cured adhesive or a heat cured adhesive, and the uncured adhesive may be a 3M optically clear laminating adhesive. The cover lids 150 are closely attached to the adhesive 160 due to the adhesiveness of the adhesive 160. In the present embodiment, the total thickness of each cover lid 150 and the adhesive 160 is T2, wherein, preferably, T2≧T1. Namely, the depth of each limiting cavity 144 is smaller than or equal to the total thickness of each cover lid 150 and the adhesive 160.

Figure 1D:
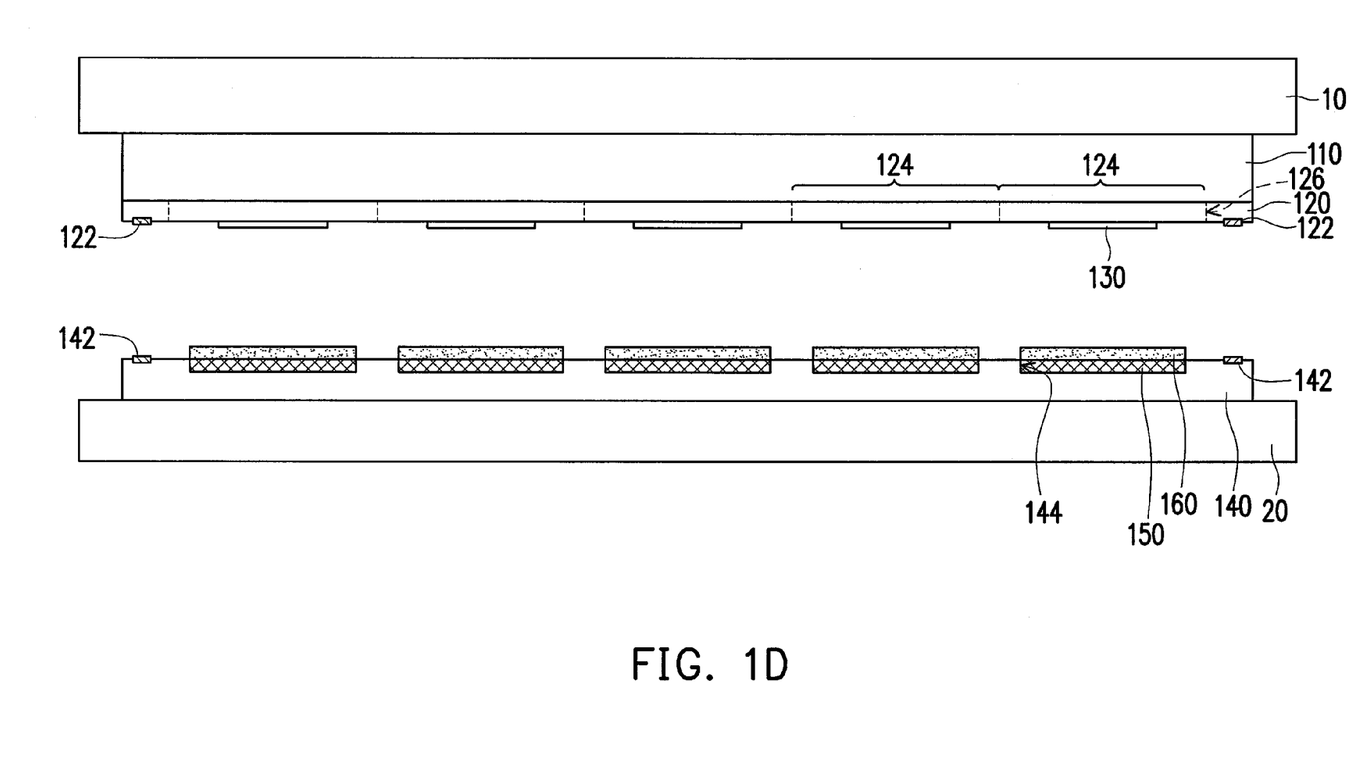
Figure 1E:
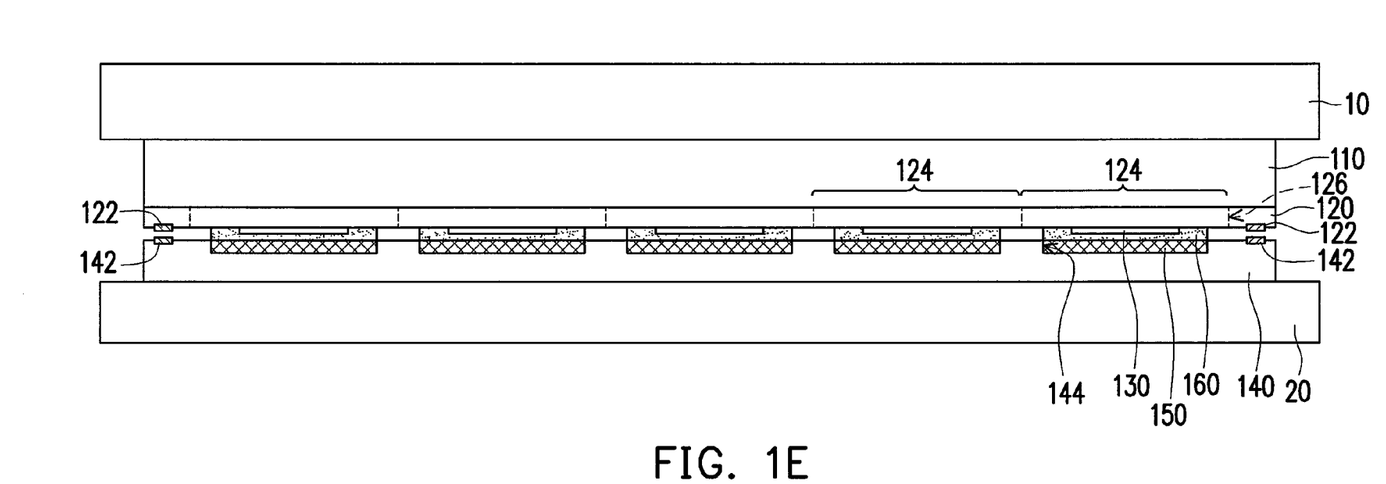

After that, referring to both FIG. 1D and FIG. 1E, the second substrate 140 and the cover lids 150 and the adhesive 160 disposed on the second substrate 140 are transmitted onto an base 20 of an encapsulation chamber (not shown) by using a robot arm (not shown), and the first substrate 120 and the second substrate 140 are laminated together with the first alignment marks 122 and the second alignment marks 142 as reference (i.e., the first alignment marks 122 on the first substrate 120 respectively correspond to the second alignment marks 142 on the second substrate 140) in an oxygen-nitrogen environment, so that the environmentally sensitive electronic elements 130 are sealed in the adhesive 160 and located between the first substrate 120 and the second substrate 140. Herein it has to be stated that after the first substrate 120 and the second substrate 140 are laminated together, each of the environmentally sensitive electronic elements 130 is corresponding to one cover lid 150 and sealed in the adhesive 160 on this cover lid 150.

Figure 1F:
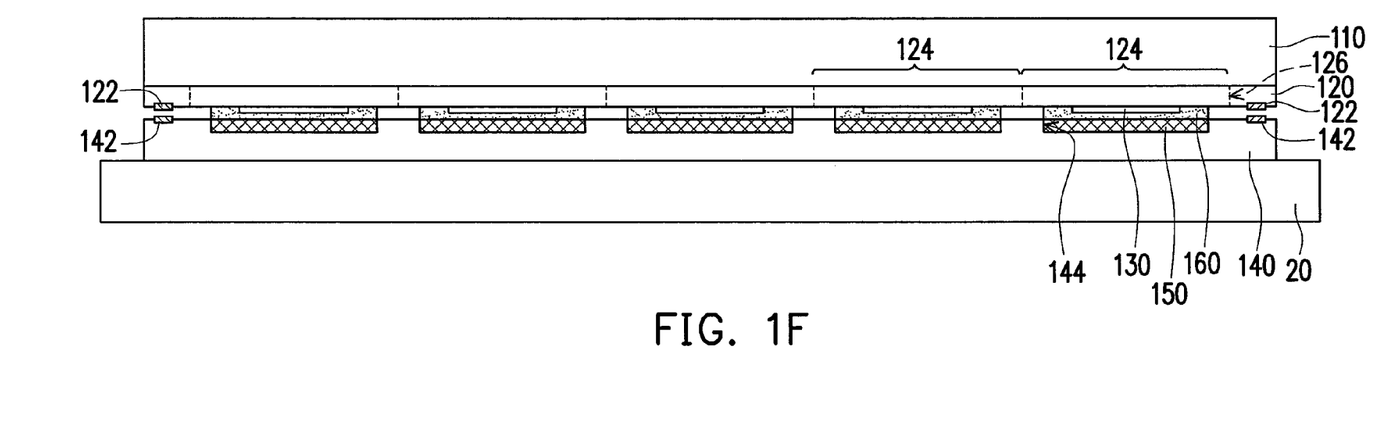
Figure 1G:
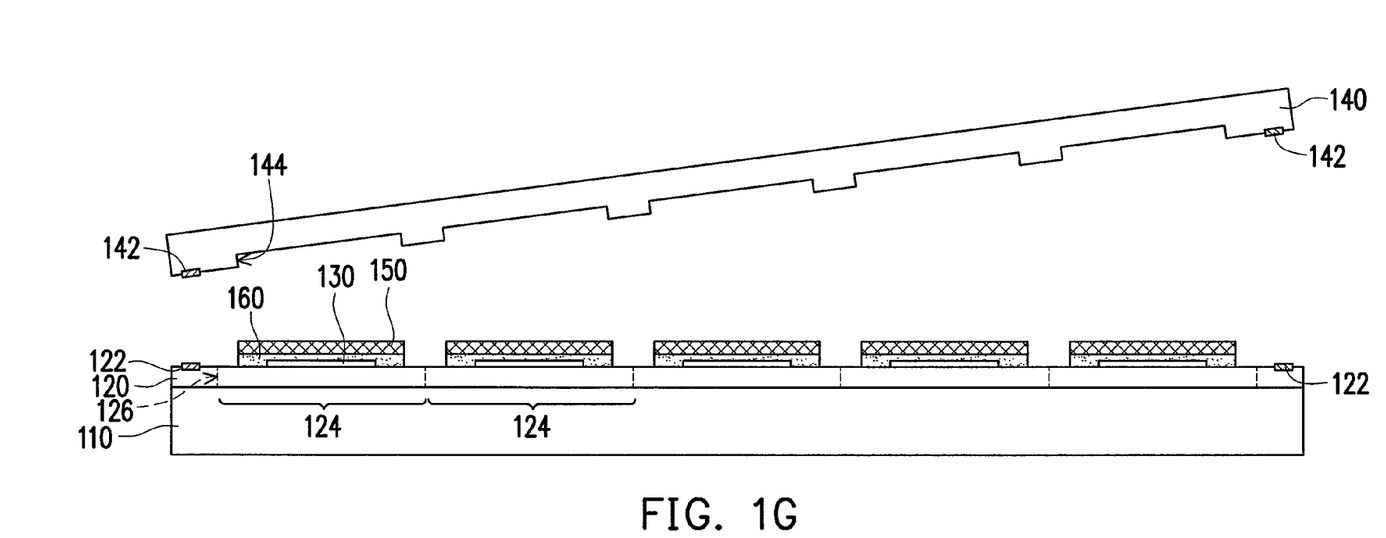

Next, referring to FIG. 1F, the carrier 110 and the vacuum chuck 10 are separated from each other. The laminated carrier 110 and second substrate 140 are transferred out of the encapsulation chamber by using a robot arm (not shown). The carrier 110 and the second substrate 140 are separated from each other. Referring to FIG. 1G, herein the cover lids 150 originally disposed in the limiting cavities 144 of the second substrate 140 are closely attached to the corresponding adhesive 160 and exposed.

Figure 1H:
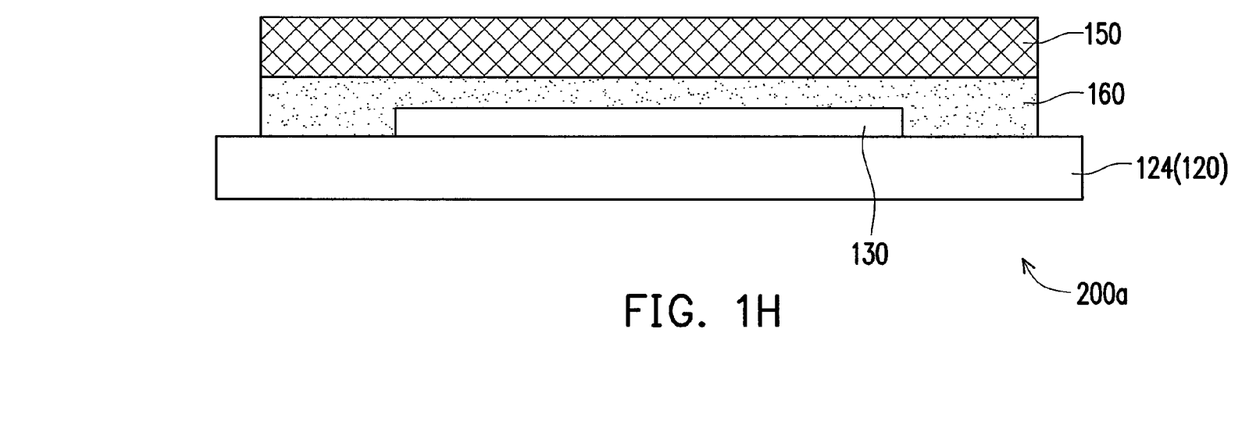

Finally, referring to FIG. 1H, a singularizing process is performed, wherein the first substrate 120 is cut along the cutting lines 126, and the vacuum chuck 10 and the carrier 110 are removed so that the surface of the first substrate 120 that is relatively further away from the environmentally sensitive electronic elements 130 is exposed and a plurality of environmentally sensitive electronic element packages 200a is formed. By now, the encapsulation of the environmentally sensitive electronic elements 130 is completed.

In the present embodiment, the first substrate 120 and the second substrate 140 are laminated together by referring to the first alignment marks 122 and the second alignment marks 142 on the first substrate 120 and the second substrate 140. Thus, the first substrate 120 and the second substrate 140 can be aligned precisely, and accordingly, the fabrication yield of the environmentally sensitive electronic element packages 200a is improved.

Moreover, in the present embodiment, the cover lids 150 are disposed in the limiting cavities 144 of the second substrate 140, and the environmentally sensitive electronic elements 130 on the first substrate 120 are encapsulated simultaneously by laminating the first substrate 120 and the second substrate 140 together. Thus, the encapsulation method in the present embodiment is very advantageous to the mass production of the environmentally sensitive electronic elements 130, and in which the problems of incomplete separation and adhesive residue in the conventional technique caused by separating the flexible cover lid by UV curing or heating the adhesive tape between the cover lid and the cover lid holder are avoided so that the reliability of the fabrication process is ensured. Besides, because the second substrate 140 in the present embodiment is a rigid substrate and can be used repeatedly, the fabrication cost is reduced.

Figure 2A:
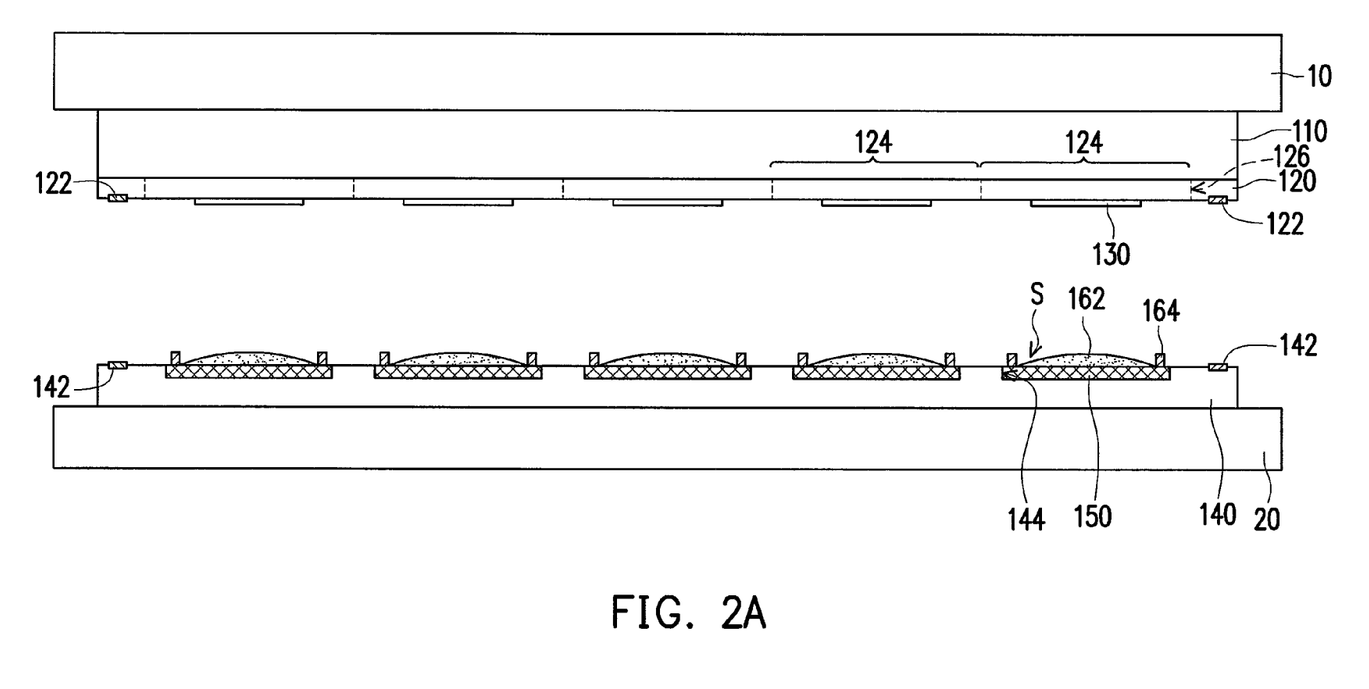
FIGS. 2A-2E are cross-sectional views illustrating an encapsulation method of an environmentally sensitive electronic element according to another embodiment of the present disclosure.

FIGS. 2A-2E are cross-sectional views illustrating an encapsulation method of an environmentally sensitive electronic element according to another embodiment of the present disclosure. Referring to FIG. 2A, the environmentally sensitive electronic element encapsulation method in the present embodiment is similar to the environmentally sensitive electronic element encapsulation method in the embodiment described above, and the difference between the two is that in the environmentally sensitive electronic element encapsulation method provided by the present embodiment, a plurality of sealants 164 is respectively formed on the cover lids 150 after the step illustrated in FIG. 1C is completed, wherein the cover lids 150 and the sealants 164 constitute a plurality of accommodating spaces S, and the sealants 164 may be made of a material with a high viscosity property, such as epoxy resin. Each of the sealants 164 surrounds one of the limiting cavities 144 respectively.

Then, referring to FIG. 2A again, a liquid adhesive 162 is formed in the accommodating spaces S through an adhesive dispensing process, wherein the liquid adhesive 162 may be made of a material with a low viscosity property (<2000 cps), and the sealants 164 and the liquid adhesive 162 may all be UV cured adhesive or heat cured adhesive. Next, the second substrate 140 and the cover lids 150, the liquid adhesive 162, and the sealants 164 disposed on the second substrate 140 are transmitted onto the base 20 of the encapsulation chamber (not shown) by using a robot arm (not shown), and the first alignment marks 122 and the second alignment marks 142 are used as reference (i.e., the first alignment marks 122 on the first substrate 120 respectively correspond to the second alignment marks 142 on the second substrate 140) in a decompression environment.

Figure 2B:
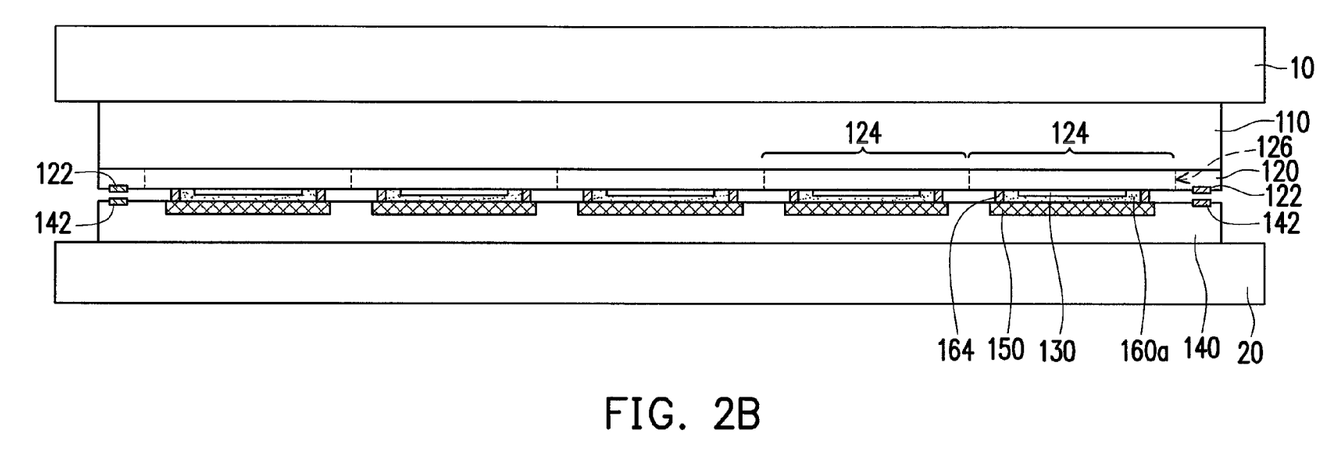

Next, referring to FIG. 2B, the liquid adhesive 162 is pre-cured to form a partially cured liquid adhesive 162. After that, the first substrate 120 and the second substrate 140 are laminated together so that the environmentally sensitive electronic elements 130 are sealed in the adhesive 160 and located in the accommodating spaces S, wherein the sealants 164 respectively surround the environmentally sensitive electronic elements 130. Herein it should be stated that after the first substrate 120 and the second substrate 140 are laminated together, each environmentally sensitive electronic element 130 is corresponding to a cover lid 150 and sealed in the adhesive 160 disposed on this cover lid 150. Thereafter, the liquid adhesive 162 is fully cured to form an adhesive 160a.

Figure 2C:
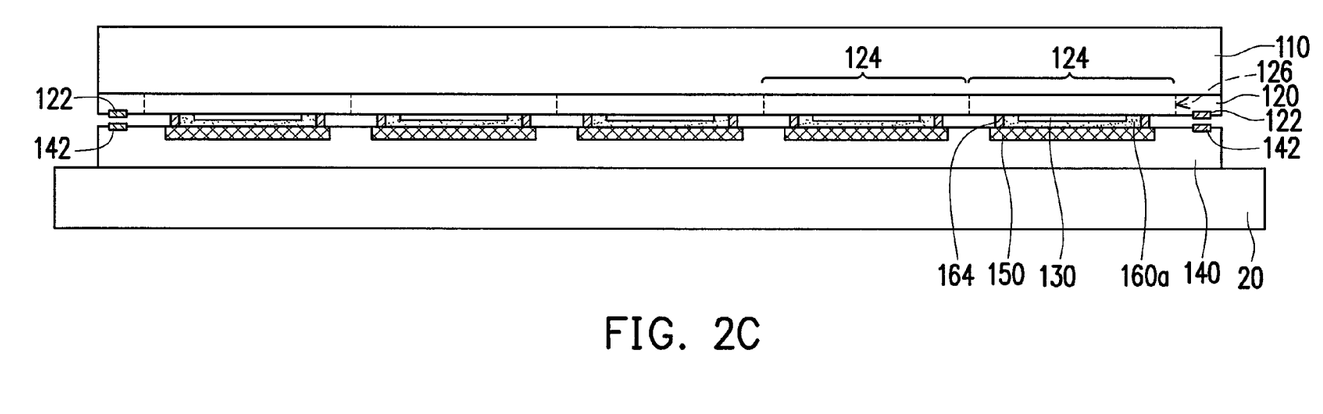
Figure 2D:
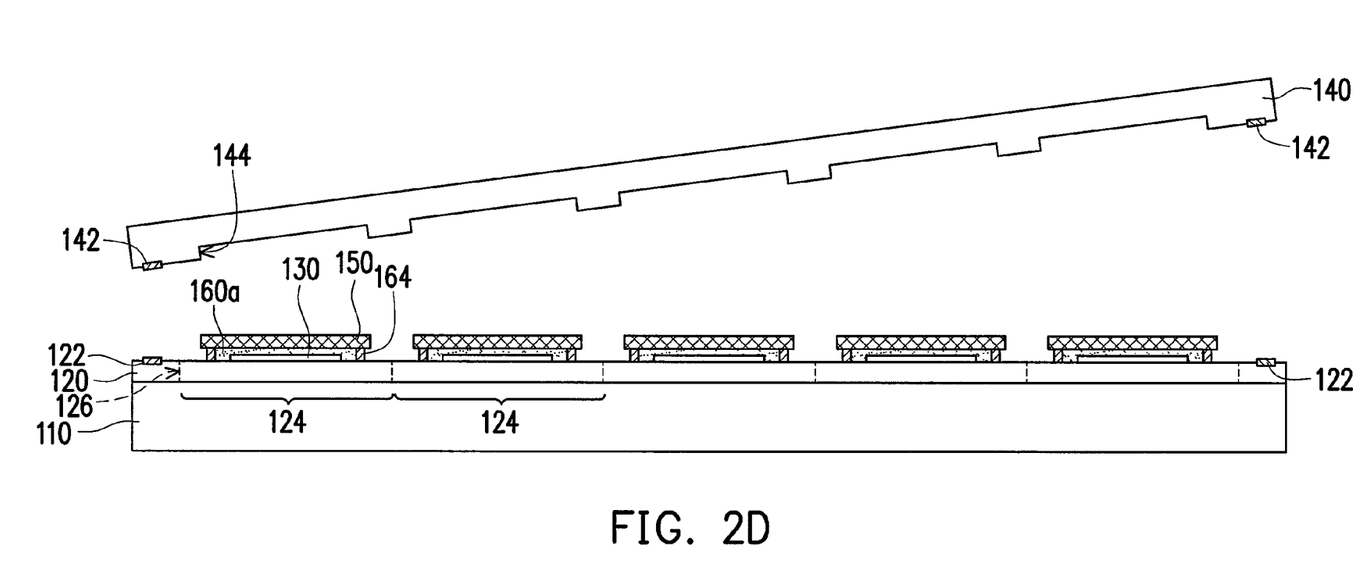

Next, referring to FIG. 2C, the carrier 110 and the vacuum chuck 10 are separated from each other. The bonded carrier 110 and second substrate 140 are transmitted out of the encapsulation chamber by using a robot arm (not shown). The carrier 110 and the second substrate 140 are then separated, as shown in FIG. 2D. Herein the cover lids 150 originally disposed in the limiting cavities 144 of the second substrate 140 are closely attached on the corresponding adhesive 160a and exposed. To be specific, because the second substrate 140 is disposed on the base 20, the base 20 is removed along with the second substrate 140 when the second substrate 140 and the cover lids 150 are separated from each other.

Figure 2E:
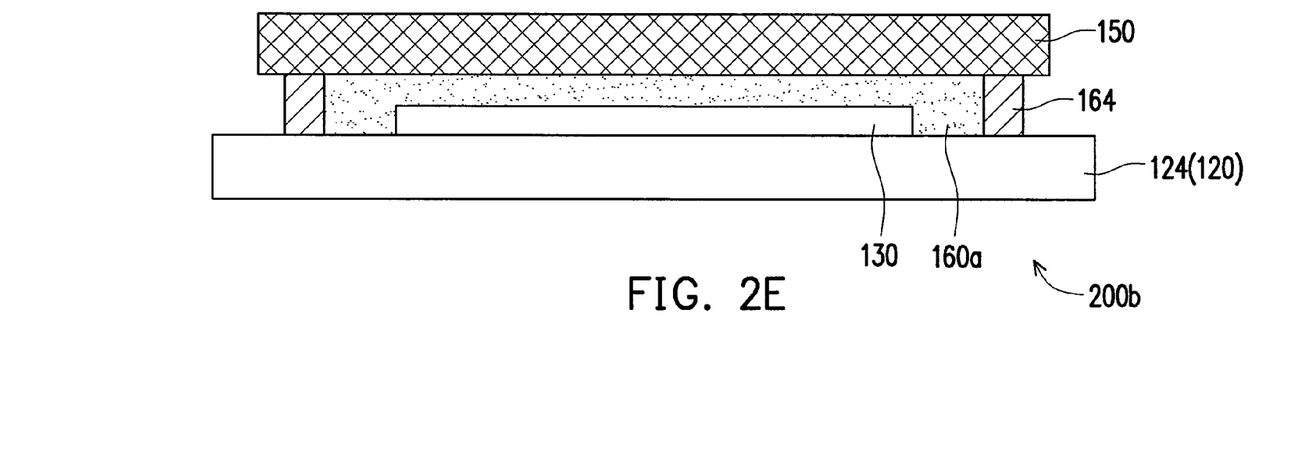

Finally, referring to FIG. 2E, a singularizing process is performed, wherein the first substrate 120 is cut along the cutting lines 126, and the vacuum chuck 10 and the carrier 110 are removed so that the surface of the first substrate 120 that is relatively further away from the environmentally sensitive electronic elements 130 is exposed and a plurality of environmentally sensitive electronic element packages 200b is formed. By now, the encapsulation of the environmentally sensitive electronic elements 130 is completed.

Figure 3:
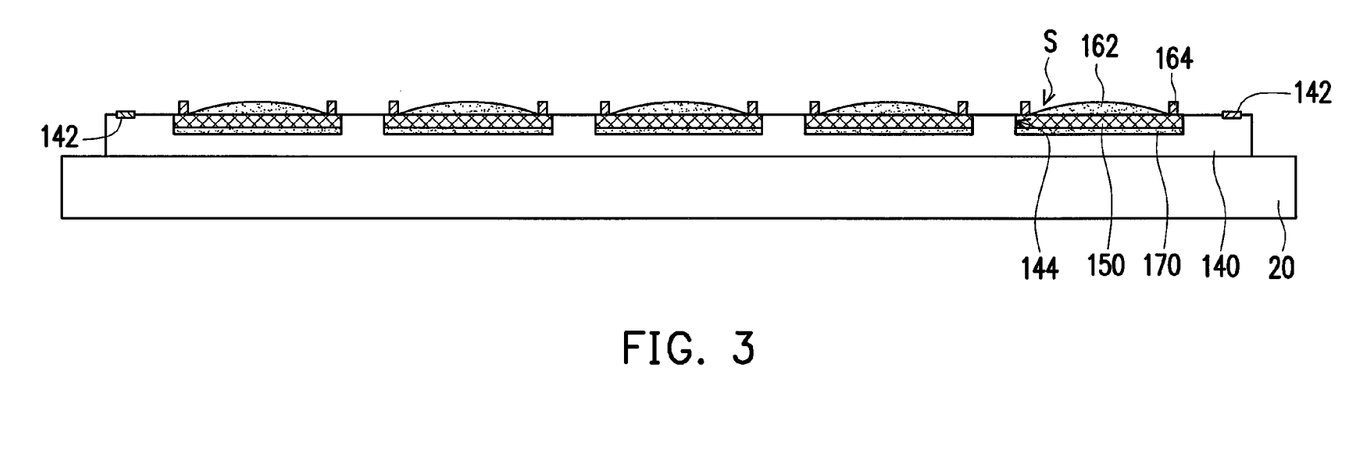
FIG. 3 is a cross-sectional view of a second substrate according to another embodiment of the present disclosure.

It has to be stated that in order to separate the second substrate 140 and the cover lids 150 conveniently, a release film 170 may be further disposed in the limiting cavities 144 before the cover lids 150 are respectively disposed in the limiting cavities 144 of the second substrate 140. While separating the second substrate 140 and the cover lids 150, the second substrate 140 may be separated from the release film 170 and the cover lids 152 may be separated from the release film 170 through lift-off processes.

In summary, in the environmentally sensitive electronic element encapsulation method provided by the present disclosure, the first substrate and the second substrate are laminated together by referring to the alignment marks on the first substrate and the second substrate. Thus, the alignment precision between the first substrate and the second substrate is improved, and the fabrication yield of the environmentally sensitive electronic element packages is also increased. Moreover, according to the present disclosure, the cover lids are disposed in the limiting cavities of the second substrate. Thus, compared to the conventional technique in which the cover lid and the cover lid holder are fixed together by using an adhesive tape, the present disclosure can prevent the problems of incomplete separation and adhesive residue caused by separating the flexible cover lids through UV curing or heating. Accordingly, the reliability of the fabrication process and the devices can be ensured.

Moreover, in the present disclosure, a plurality of cover lids on the second substrate and a plurality of environmentally sensitive electronic elements on the first substrate are simultaneously encapsulated by laminating the first substrate and the second substrate. Thus, the present disclosure is very advantageous to the mass production of the environmentally sensitive electronic elements. Furthermore, because the second substrate in the present disclosure can be repeatedly used, the fabrication cost is reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An encapsulation method of an environmentally sensitive electronic element, comprising:
    providing a first substrate, wherein at least one first alignment mark and a plurality of environmentally sensitive electronic elements are formed on the first substrate;
    providing a second substrate, wherein at least one second alignment mark and a plurality of limiting cavities are formed on the second substrate;
    disposing a plurality of cover lids in the limiting cavities;
    forming an adhesive on the cover lids;
    laminating the first substrate and the second substrate together with the first alignment mark and the second alignment mark as reference, so that the environmentally sensitive electronic elements are sealed in the adhesive and located between the first substrate and the second substrate; and
    separating the second substrate and the cover lids.

2. The encapsulation method according to claim 1, wherein a depth of each of the limiting cavities is T1, a total thickness of each of the cover lids and the adhesive is T2, and $T2 \geq T1$.

3. The encapsulation method according to claim 1 further comprising:
    providing a carrier before providing the first substrate, wherein the carrier is suitable for carrying the first substrate; and
    removing the second substrate after laminating the first substrate and the cover lids together.

4. The encapsulation method according to claim 1 further comprising:
    disposing a release film in the limiting cavities before disposing the cover lids in the limiting cavities; and
    separating the second substrate and the cover lids, and then separating the cover lids and the release film.

5. The encapsulation method according to claim 1 further comprising:
    forming a plurality of sealants on the cover lids after respectively disposing the cover lids in the limiting cavities, wherein the cover lids and the sealants form a plurality of accommodating spaces, wherein the environmentally sensitive electronic elements are located in the accommodating spaces after bonding the first substrate and the second substrate.

6. The encapsulation method according to claim 5, wherein the step of forming the adhesive comprises:
    forming a liquid adhesive in the accommodating spaces through an adhesive dispensing process;
    pre-curing the liquid adhesive before bonding the first substrate and the second substrate; and
    fully curing the liquid adhesive to form the adhesive after bonding the first substrate and the second substrate.

7. The encapsulation method according to claim 5, wherein after the first substrate and the second substrate are laminated together, the environmentally sensitive electronic elements are respectively located in the accommodating spaces, and the sealants respectively surround the environmentally sensitive electronic elements.

8. The encapsulation method according to claim 1 further comprising:
    performing a singularizing process to form a plurality of environmentally sensitive electronic element packages after separating the second substrate and the cover lids.

9. The encapsulation method according to claim 8, wherein the first substrate has a plurality of substrate units, each of the substrate units is defined by a plurality of cutting lines, the environmentally sensitive electronic elements are respectively located in the substrate units, and the step of performing the singularizing process comprises:
    cutting the first substrate along the cutting lines to form the environmentally sensitive electronic element packages.

10. The encapsulation method according to claim 1, wherein the environmentally sensitive electronic elements are formed on the first substrate by taking the first alignment mark as a reference point.

11. The encapsulation method according to claim 1, wherein the cover lids comprise a plurality of flexible cover lids.

12. The encapsulation method according to claim 1, wherein the first substrate comprises a flexible substrate.

13. The encapsulation method according to claim 1, wherein the second substrate comprises a rigid substrate.

* * * * *